US010713979B2

(12) United States Patent
Cai et al.

(10) Patent No.: US 10,713,979 B2
(45) Date of Patent: Jul. 14, 2020

(54) UNLOADING DEVICE AND SELF-UNLOADING DISPLAY DEVICE

(71) Applicant: ROE Visual Co., Ltd., Shenzhen (CN)

(72) Inventors: Danhu Cai, Shenzhen (CN); Yongfei Yu, Shenzhen (CN); Shunwen Tian, Shenzhen (CN); Ping Wu, Shenzhen (CN); Sen Zhang, Shenzhen (CN); Zhanqiang Li, Shenzhen (CN); Chen Lu, Shenzhen (CN); Dries Vermeulen, Shenzhen (CN)

(73) Assignee: ROE Visual Co., Ltd., Shenzhen (CN)

(*) Notice: Subject to any disclaimer, the term of this patent is extended or adjusted under 35 U.S.C. 154(b) by 228 days.

(21) Appl. No.: 16/047,279

(22) Filed: Jul. 27, 2018

(65) Prior Publication Data

US 2018/0374400 A1    Dec. 27, 2018

Related U.S. Application Data

(63) Continuation of application No. PCT/CN2018/082566, filed on Apr. 10, 2018.

(30) Foreign Application Priority Data

Apr. 11, 2017 (CN) .......................... 2017 1 0233922

(51) Int. Cl.
*G09F 9/302* (2006.01)
*H05K 7/18* (2006.01)
(Continued)

(52) U.S. Cl.
CPC ............. *G09F 9/302* (2013.01); *F16M 11/00* (2013.01); *H05K 7/18* (2013.01); *G06F 3/1446* (2013.01)

(58) Field of Classification Search
CPC ......... Y10T 29/53683; Y10T 29/53891; G02F 1/133308; G02F 2001/133322; G02F 2001/133314
See application file for complete search history.

(56) References Cited

U.S. PATENT DOCUMENTS 7,006,169 B2*  2/2006  Liu ................... G02F 1/133308
                                                   349/58
9,234,652 B2*  1/2016  Wu ........................ F21V 19/001
(Continued)

FOREIGN PATENT DOCUMENTS

CN          203535912 U  *  4/2014  ........... G09F 9/3026

*Primary Examiner* — Tyrone V Hall, Jr.
(74) *Attorney, Agent, or Firm* — Westbridge IP LLC

(57) ABSTRACT

The present invention discloses an unloading device and a self-unloading display device having a first component or a second component cooperatively installed, the first and the second component respectively have a cooperative installation surface, the cooperative installation surface of the first component is provided with at least one unloading device; the unloading device comprises a driving device and a pushing mechanism; the pushing mechanism is connected to a driving device in a transmission way, the pushing mechanism has at least a set of telescopic dowel bars, an end part of the dowel bar is an inclined surface, a small end formed by the inclined surface is arranged close to the cooperative installation surface of the first component; the driving device drives the dowel bar to move along the cooperative installation surface of the first component, the inclined surface of the dowel bar abuts with and moves along the second component.

19 Claims, 10 Drawing Sheets

(51) Int. Cl.
*F16M 11/00* (2006.01)
*G06F 3/14* (2006.01)

(56) References Cited

U.S. PATENT DOCUMENTS

| | | | | |
|---|---|---|---|---|
| 2008/0024695 A1* | 1/2008 | Yan | .................. | G02F 1/133308 349/58 |
| 2015/0195932 A1* | 7/2015 | Lee | ...................... | H05K 5/0217 361/749 |
| 2016/0040764 A1* | 2/2016 | Park | .......................... | F16H 1/16 361/679.01 |
| 2017/0193863 A1* | 7/2017 | Cho | .......................... | G06F 1/16 |

* cited by examiner

UNLOADING DEVICE AND SELF-UNLOADING DISPLAY DEVICE

CROSS-REFERENCE TO RELATED APPLICATIONS

This application is a continuation of International application No. PCT/CN2018/082566 filed on Apr. 10, 2018, which claims the benefit and priority of Chinese patent application No. 201710233922.0 filed on Apr. 11, 2017. Both of these applications are incorporated herein in their entirety by reference.

TECHNICAL FIELD

The present invention relates to an unloading device and a display device, and more particularly, to an unloading device and a self-unloading display device.

BACKGROUND

The existing display screen usually includes a display screen frame and a display screen installed in the display screen frame, wherein a signal connector of the display screen is connected to a signal interface on the display screen frame. Since the connection between the signal connector of the display screen and the signal interface on the display screen frame has certain tightness, and both the frame and the display screen are provided with a magnet, and the two are adsorbed by the magnets, so that the display screen and the frame are tightly installed. Therefore, when a display module needs to be unloaded from a display screen box, the display screen needs to be adsorbed by a magnetic auxiliary screen disassembly tool, so as to disassemble the display screen by offsetting the magnet adsorption force between the display screen and the frame. However, this situation is prone to have the problem that the lamp beads of the display screen are damaged by the magnetic auxiliary screen disassembling tool; moreover, on one hand, the magnetic auxiliary screen disassembling tool has a heavier weight, after the screen is disassembled, the magnetic auxiliary screen disassembling tool is possible to fall off, and the magnetic auxiliary screen disassembly tool is much heavier and is not convenient to operate.

SUMMARY

The object of the present invention is to provide an unloading device and a self-unloading display device to overcome the defects of the prior art above. The present invention is convenient in use, saves time and labor, and facilitates the convenient unloading of a display screen installed on a frame.

In order to achieve the object above, the present invention provides an unloading device having a first component or a second component cooperatively installed, the first component and the second component respectively have a cooperative installation surface, and the cooperative installation surface of the first component is provided with at least one unloading device;

the unloading device comprises a driving device and a pushing mechanism;

the pushing mechanism is connected to the driving device in a transmission way, the pushing mechanism has at least a set of telescopic dowel bars, an end part of the dowel bar is an inclined surface, and a small end formed by the inclined surface is arranged close to the cooperative installation surface of the first component; and the driving device drives the dowel bar to move along the cooperative installation surface of the first component, when the dowel bar moves towards the second component, the inclined surface of the dowel bar abuts with and moves along the second component, so as to separate the first component from the second component.

Preferably, the driving device has a first transmission piece;

the pushing mechanism has a second transmission piece, and the first transmission piece and the second transmission piece form an interlaced shaft transmission;

the dowel bar comprises a first dowel bar and a second dowel bar, and an axis of the second transmission piece is provided with the first dowel bar connected therewith;

an end part of the first dowel bar is movably connected to the second dowel bar, the second dowel bar linearly moves relative to the first dowel bar, and a moving direction of the second dowel bar and an extension direction of the first dowel bar are consistent or form an included angle; and the second dowel bar is slidably arranged in the cooperative installation surface of the first component, and an end part of the second dowel bar is provided with the inclined surface.

Preferably, the driving device is a motor;

the first transmission piece is an output shaft connected to the driving device in a transmission way, and has a spiral groove on an outer surface thereof;

the second transmission piece is a gear meshed with the output shaft, so that the output shaft is connected to the gear in a worm and gear way;

an axis of the gear is provided with the first dowel bar;

the first dowel bar is a short shaft arranged on the axis of the gear; and the second dowel bar is a bar body having a connecting hole at the end part, and the connecting hole is spirally sleeved with the short shaft.

Preferably, the driving device is a cylinder;

the first transmission piece is a gear rack connected to the driving device in a transmission way, and the surface thereof has gear teeth;

the second transmission piece is a gear meshed with the gear rack, so that the gear rack is connected to the gear in a gear rack way;

an axis of the gear is provided with the first dowel bar;

the first dowel bar is a short shaft arranged on the axis of the gear; and the second dowel bar is a bar body having a connecting hole at the end part, and the connecting hole is spirally sleeved with the short shaft.

Preferably, two sets of the first dowel bars are symmetrically arranged along the axis relative to the second transmission piece.

Preferably, the second dowel bar comprises a shaft sleeve connected to the short shaft and a pushing rod detachably clamped with the shaft sleeve, one end of the shaft sleeve is provided with the connecting hole, the other end thereof is provided with a concave clamping groove, one end of the pushing rod is provided with a clamping head adapted to the clamping groove, the other end thereof is provided with the inclined surface, and the shaft sleeve is detachably clamped with the pushing rod by the clamping groove and the clamping head.

Preferably, the inclined surface has at least two sub-inclined surfaces with different angles, the sub-inclined surfaces are connected to each other, and a slop of the sub-inclined surface arranged closer to the cooperative installation surface of the first component is smaller than a slope of the sub-inclined surface arranged farther away from the cooperative installation surface of the first component.

Preferably, the sub-inclined surface comprises a first sub-inclined surface and a second sub-inclined surface, the first sub-inclined surface is arranged close to the cooperative installation surface of the first component, the second sub-inclined surface is arranged far from the cooperative installation surface of the first component, the slop of the first sub-inclined surface is 30 degrees, and the slop of the second sub-inclined surface is 45 degrees.

Preferably, the end of the second dowel bar provided with the inclined surface is formed with a pushing head having a width larger than the width of the second dowel bar.

Preferably, the clamping groove is connected to the clamping head in a wedged way.

Preferably, a guiding groove for positioning the second dowel bar is arranged at an installation position of the second dowel bar in the cooperative installation surface of the first component, so that the second dowel bar is stuck inside the guiding groove and moves along the guiding groove.

Preferably, the guiding groove is a straight groove, the second dowel bar is a straight bar, a plurality of positioning bars for positioning the straight bar are spanned on an opening of the straight groove by intervals, and the positioning bar is arranged vertical to the extension direction of the straight bar.

Preferably, the guiding groove is connected to the second dowel bar by a T-shaped ring groove structure.

Preferably, the guiding groove is a Y-shaped groove, which has at least two branches, and the second dowel bar is a Y-shaped bar matched with the guiding groove.

Preferably, the cooperative installation surface of the second component is provided with at least one abutting end.

Preferably, the abutting end of the second component is arranged in a raised manner.

Preferably, the abutting end is a protruding boss, the boss is a rectangle entirely, the boss is arranged to extend towards the cooperative installation surface of the first component, and a contact surface between the abutting end and the inclined surface is also arranged inclinedly.

The present invention further relates to a self-unloading display device comprising the unloading device according to any one of the items above, the self-unloading display device comprises a display screen and a frame, the display is a first component, the frame is a second component, the display screen and the frame are cooperatively installed, and a cooperative installation surface of the first component is provided with the unloading device.

The present invention further relates to a self-unloading display device comprising the unloading device according to any one of the items above, the self-unloading display device comprises a display screen and a frame, the frame is a first component, the display screen is a second component, the frame and the display screen are cooperatively installed, and a cooperative installation surface of the first component is provided with the unloading device.

The present invention further relates to a self-unloading display device comprising the unloading device according to any one of the items above, the self-unloading display device comprises a display screen and a frame, the display screen is a first component, the frame is a second component, the frame and the display screen are cooperatively installed, and a cooperative installation surface of the first component and a cooperative installation surface of the second component are both provided with the unloading device.

Preferably, the cooperative installation surface of the first component and the cooperative installation surface of the second component are both provided with an abutting end.

The present invention has the beneficial effects that: by arranging the unloading device on the cooperative installation surface of the first component and starting the driving device of the unloading device by a control device, the driving device drives the linkage between the first transmission piece and the pushing mechanism, the pushing mechanism drives the first dowel bar on the second transmission piece to move, the first dowel bar drives the second dowel bar to move, and the second dowel bar abuts with the second component or abuts with the abutting end on the second component, so that the first component is displaced relative to the second component, thus forming a gap between the first component and the second component, and when the operator separates the first component from the second component, and when the display is a first component and the frame is a second component, the first component is held to take off the display screen from the second component.

Similarly, when the frame is a first component and the display screen is a second component, the second component is held. Therefore, when the display screen needs to be replaced, and dismantled for maintenance or changing the installation position thereof, and the unloading device can automatically separate the display screen from the frame, thus reducing the damage of the strong magnetic screen disassembly device to the LED lamp beads on a display panel during adsorption, and it is convenient in disassembly and is efficient in work. The present invention has a simple overall structure, is easy to produce and manufacture, has low cost, is easy to use, has strong adaptability, and saves time and labor.

BRIEF DESCRIPTION OF DRAWINGS

These and other aspects will become apparent and more readily appreciated from the following description of the embodiments, taken in conjunction with the accompanying drawings in which.

DETAILED DESCRIPTION OF THE EMBODIMENTS

Figure 1:
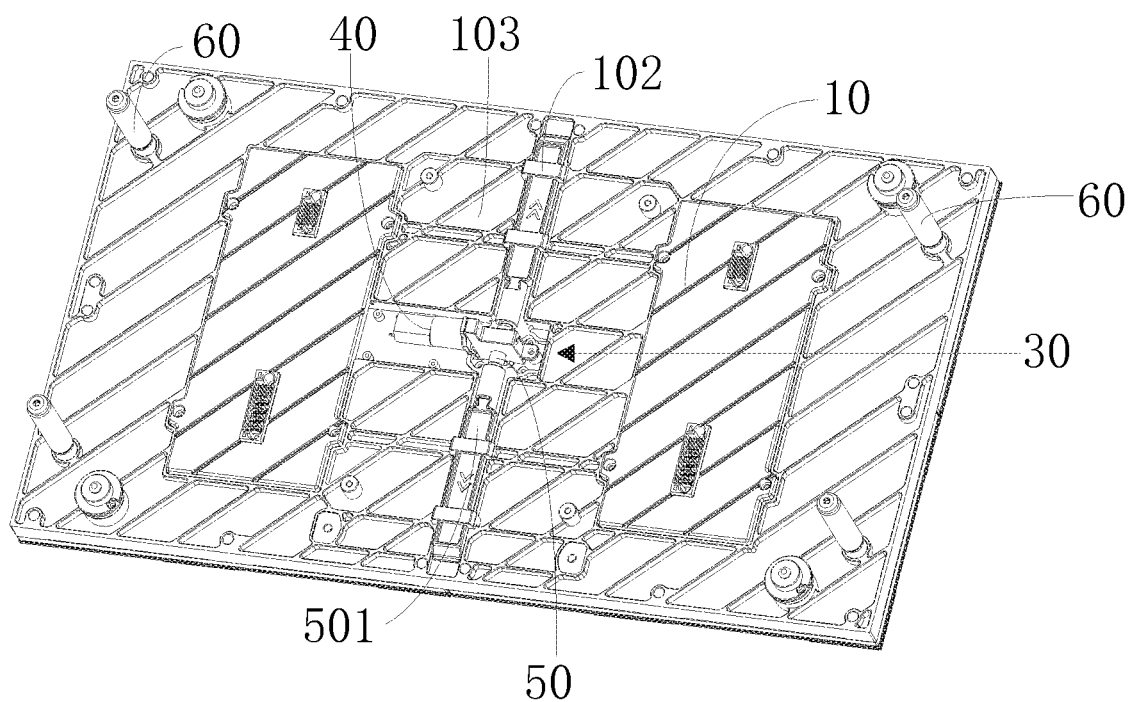
FIG. 1 is a schematic diagram illustrating an overall structure of the present invention.

The embodiments of the present invention will be described in detail hereinafter, the examples of the embodiments are shown in the accompanying drawings, wherein the same or similar reference numerals throughout the drawings denote the same or similar elements or the elements having the same or similar functions. The embodiments described below with reference to the accompanying drawings are exemplary and are intended to explain the present invention, but cannot be construed as limiting the present invention.

Referring to FIG. 1 to FIG. 13, in a first embodiment of the present invention below, a first component 10 is configured as a display screen, a second component 20 is configured as a frame, the frame is adsorbed with the display screen by a magnet, this embodiment is also a main embodiment of the present invention in practical application, and the display screen and the frame become an integrated self-unloading display device after assembly. The present invention provides an unloading device having a first component 10 or a second component 20 cooperatively installed, the first component 10 and the second component 20 respectively have a cooperative installation surface, the installation surface of the first component 10 is provided with at least one unloading device 30, and the unloading device 30 comprises a driving device 40 and a pushing mechanism 50; the pushing mechanism 50 is connected to the driving device 40 in a transmission way, the pushing mechanism 50 has at least a set of telescopic dowel bars 501, an end part of the dowel bar 501 is an inclined surface 502, and a small end formed by the inclined surface 502 is arranged close to the cooperative installation surface 103 of the first component; and the driving device 40 drives the dowel bar 501 to move along the cooperative installation surface 103 of the first component, when the dowel bar 501 moves towards the second component 20, the inclined surface 502 of the dowel bar 501 abuts with and moves along the second component 20, so as to separate the first component 10 from the second component 20.

By applying the technical solution of the embodiment of the present invention, the driving device 40 and the pushing mechanism 50 are arranged on the cooperative installation surface 103 of the first component to perform linkage, so as to enable the pushing mechanism 50 to move along the first component 10, so that the pushing mechanism 50 can press the second component 20 by the inclined surface 502, the inclined surface 502 slides on the second component 20 to gradually separate the first component 10 from the second component 20, so as to create a gap therebetween, and the first component 10 is separated from the magnetic adsorption of the second component 20, so as to facilitate the disassembly of the first component 10.

Figure 2:
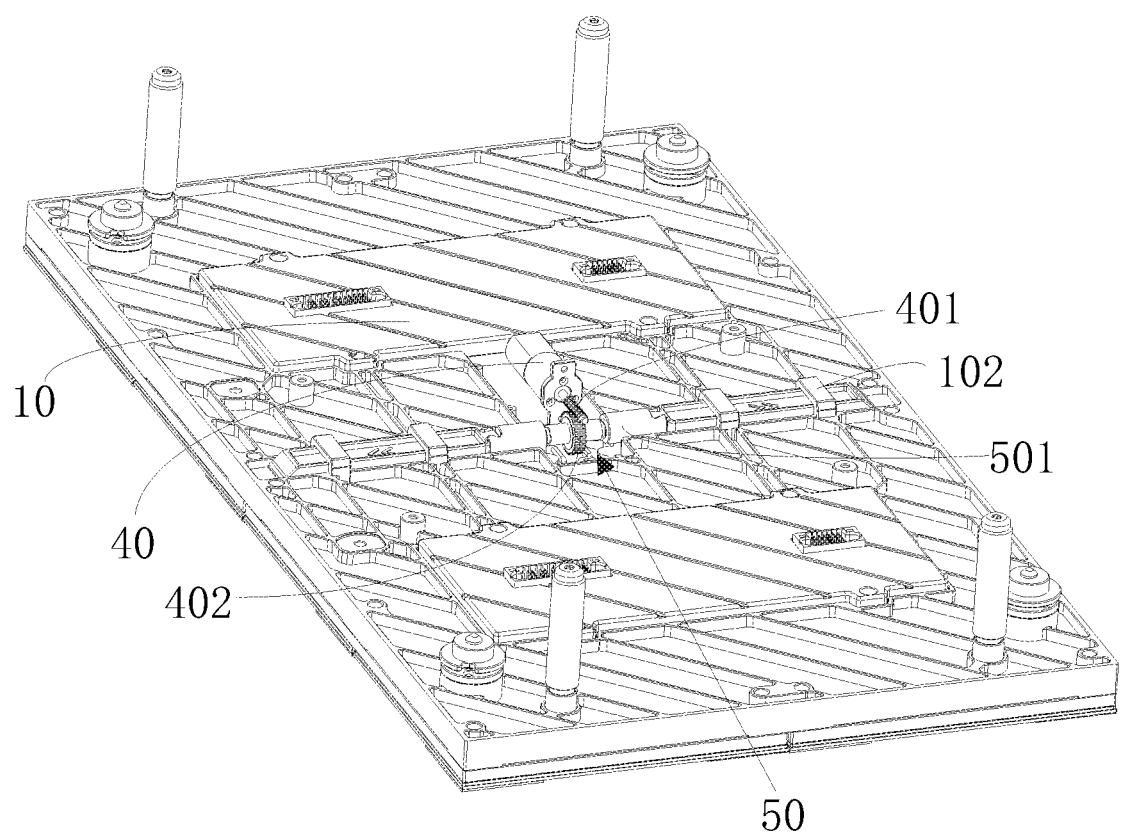
FIG. 2 is a schematic diagram illustrating an overall structure of the present invention from another angle.
Figure 3:
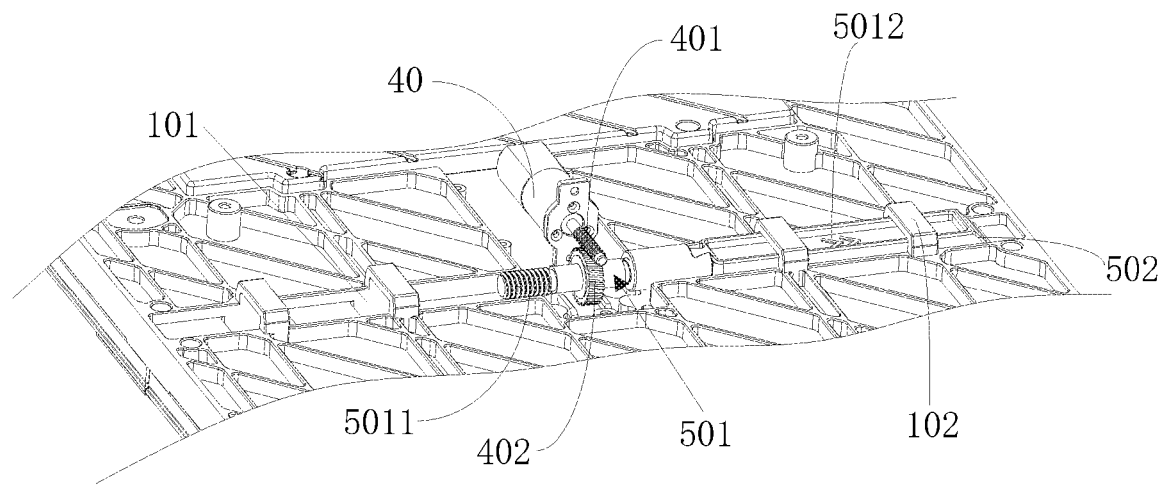
FIG. 3 is an enlarged diagram of an unloading device of the present invention.

Further, referring to FIG. 1 to FIG. 3, the driving device 40 has a first transmission piece 401; the pushing mechanism 50 has a second transmission piece 402, and the first transmission piece 401 and the second transmission piece 402 form an interlaced shaft transmission; the dowel bar 501 comprises a first dowel bar 5011 and a second dowel bar 5012, and an axis of the second transmission piece 402 is provided with the first dowel bar 5011 connected therewith; an end part of the first dowel bar 5011 is movably connected to the second dowel bar 5012, the second dowel bar 5012 linearly moves relative to the first dowel bar 5011, and a moving direction of the second dowel bar 5012 and an extension direction of the first dowel bar 5011 are consistent or form an included angle; and the second dowel bar 5012 is slidably arranged in the cooperative installation surface 103 of the first component, and an end part of the second dowel bar 5012 is provided with the inclined surface 502.

Figure 4:
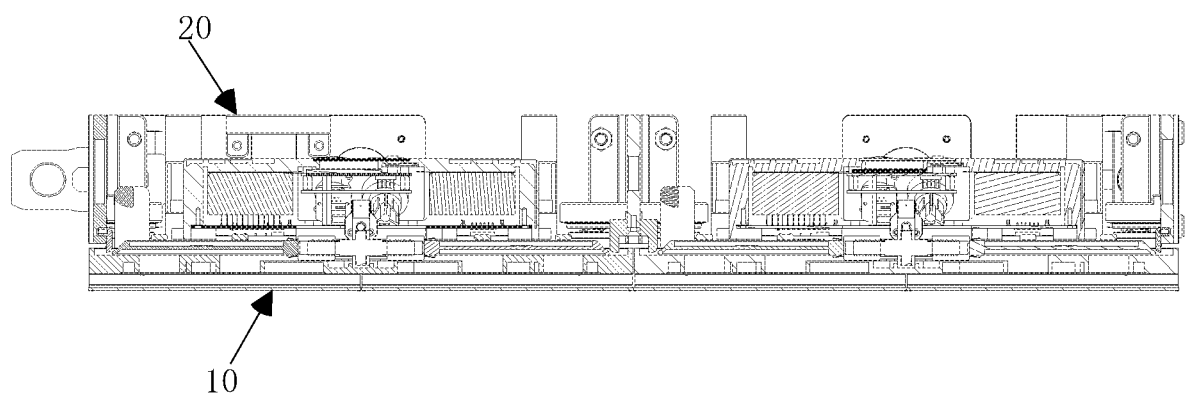
FIG. 4 is an entire sectional view of the present invention.
Figure 5:
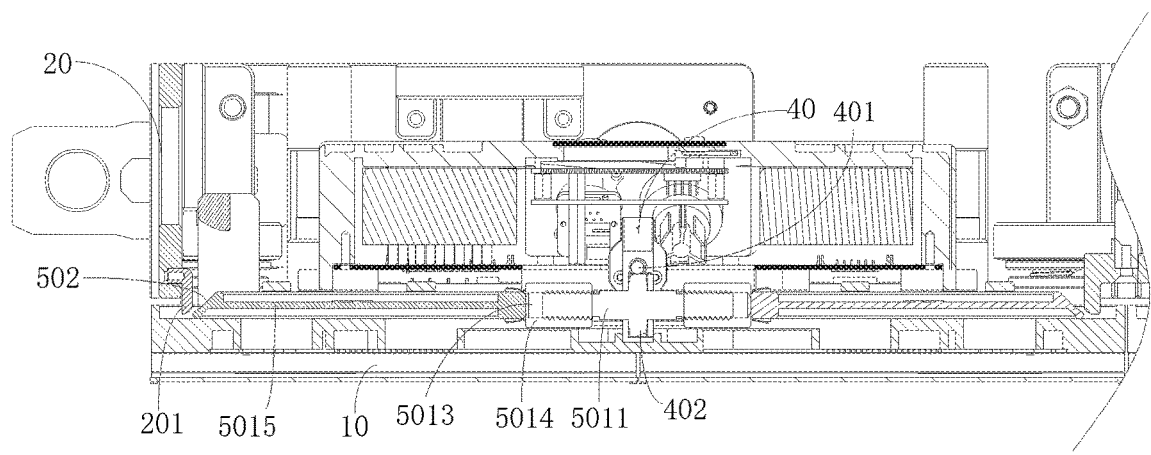
FIG. 5 is an enlarged diagram of a sectional view of the present invention.

Referring to FIG. 4 to FIG. 5, and further, the driving device 40 is a motor; the first transmission piece 401 is an output shaft connected to the driving device 40 in a transmission way, and has a spiral groove on an outer surface thereof; the second transmission piece 402 is a gear meshed with the output shaft, so that the output shaft is connected to the gear in a worm and gear way; an axis of the gear is provided with the first dowel bar 5011; The first dowel bar 5011 is a short shaft arranged on the axis of the gear; and the second dowel bar 5012 is a bar body having a connecting hole 5013 at the end part, and the connecting hole 5013 is spirally sleeved with the short shaft.

Further, the driving device 40 is a cylinder; the first transmission piece 401 is a gear rack connected to the driving device 40 in a transmission way, and the surface thereof has gear teeth; the second transmission piece 402 is a gear meshed with the gear rack, so that the gear rack is connected to the gear in a gear rack way; an axis of the gear is provided with the first dowel bar 5011; the first dowel bar 5011 is a short shaft arranged on the axis of the gear; and the second dowel bar 5012 is a bar body having a connecting hole 5013 at the end part, and the connecting hole 5013 is spirally sleeved with the short shaft.

The first transmission piece 401 can be the output shaft rotatably connected to the driving device 40, the driving device 40 can drive the output shaft to rotate, and when the driving device 40 is the motor, the first transmission piece 401 can directly be the output shaft of the motor. When the driving device 40 is the cylinder, the output shaft can be the gear rack connected to an output end of the cylinder, the gear rack is meshed with the gear, and when the cylinder is linked with the gear rack, the gear rack drives the gear to rotate, so as to drive the first dowel bar 5011 to rotate. The driving device can be other power component certainly.

Further, two sets of the first dowel bars 5011 are symmetrically arranged along the axis relative to the second transmission piece 402, thus forming a double-screw rod connection.

In order to facilitate the production and manufacturing, the first transmission piece 401 is connected to the second transmission piece 402 in a worm and gear way, the short shaft can be integrally formed with the gear, two short shafts are preferably arranged at two end surfaces of the gear respectively, and certainly, one short shaft is also available. When two short shafts are provided, the pushing force is more balanced on the second component 20, and the first component 10 can be effectively separated from the second component 20.

Figure 6:
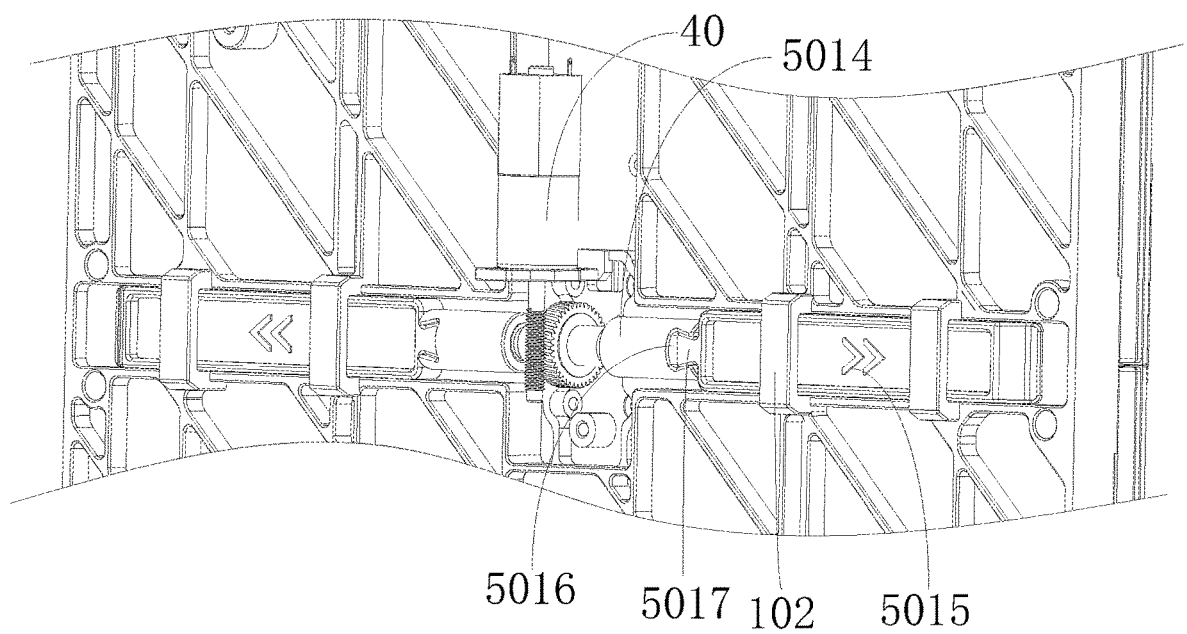
FIG. 6 is an enlarged diagram of the loading device of the present invention from another angle.

Referring to FIG. 6, and further, the second dowel bar 5012 comprises a shaft sleeve 5014 connected to the short shaft and a pushing rod 5015 detachably clamped with the shaft sleeve 5014, one end of the shaft sleeve 5014 is provided with the connecting hole 5013, the other end thereof is provided with a concave clamping groove 5016, one end of the pushing rod 5015 is provided with a clamping head 5017 adapted to the clamping groove 5016, the other end thereof is provided with the inclined surface 502, and the shaft sleeve 5014 is detachably clamped with the pushing rod 5015 by the clamping groove 5016 and the clamping head 5017.

Figure 9:
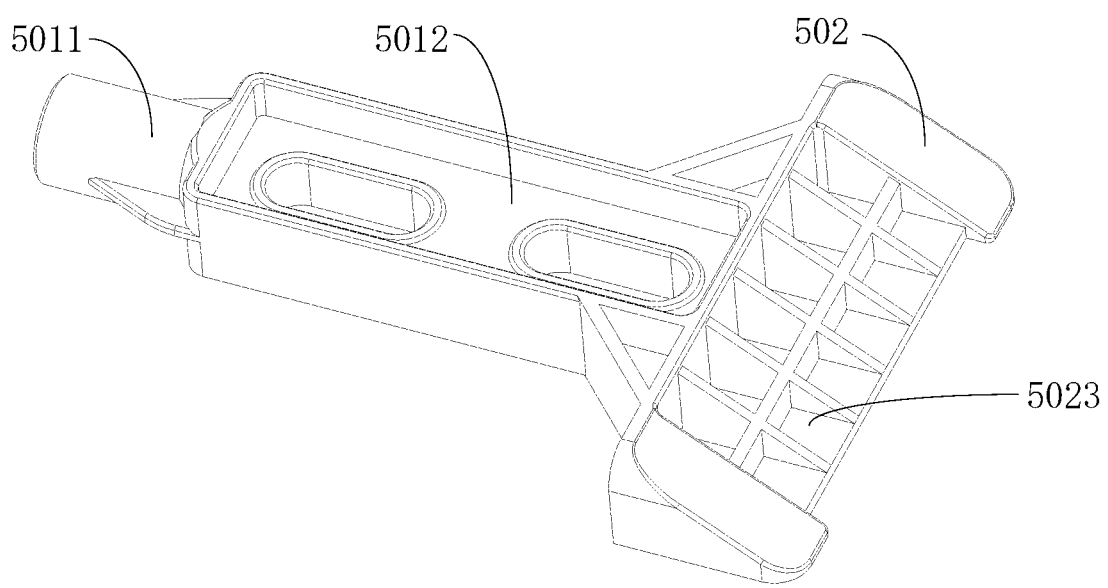
FIG. 9 is a structural schematic diagram of another embodiment of the second dowel bar of the present invention.

Referring to FIG. 9, and further, the end of the second dowel bar 5012 provided with the inclined surface 502 is formed with a pushing head 5023 having a width larger than the width of the second dowel bar 5012, and the pushing head 5023 can enlarges the contact area with the first component 10 or the second component 20, so that the pushing force of the second dowel bar 5012 is more stable, the intensity is more stable and larger, and the problem about the failure of pushing caused by the relative displacement of the second dowel bar 5012 and the abutting end is reduced. The pushing head 5023 can be set into a plurality of shapes, for example, when the pushing head 5023 is a trapezoidal block, the small end of the trapezoidal block is connected to the end part of the second dowel bar 5012, two inclined sides of the trapezoidal block are located at two sides of the moving direction of the second dowel bar 5012, and the inclined surface is located on the trapezoidal block, when the pushing head 5023 is a rectangular block, the long side of the rectangular block is connected to the end part of the second dowel bar 5012, and the inclined surface is located on the rectangular block, which will not be elaborated herein.

Further, the clamping groove 5016 is connected to the clamping head 5017 in a joggled joint way, which enables the assembly and disassembly to be easier and faster.

In practical application, the separation distance between the first component 10 and the second component 20 is actually greater than or equal to the thickness of the second dowel bar 5012 vertical to the direction of the first component 10. Therefore, a size and a thickness of the second dowel bar 5012 can be set according to different usage conditions, and the separation dimension between the first component 10 and the second component 20 is adjusted. Therefore, the second dowel bar 5012 is configured as detachable shaft sleeve 5014 and pushing rod 5015, the shaft sleeve 5014 is disassembly clamped with the pushing rod 5015, so as to facilitate the replacement of the pushing rod 5015 with different size to meet different pushing distances.

Figure 7:
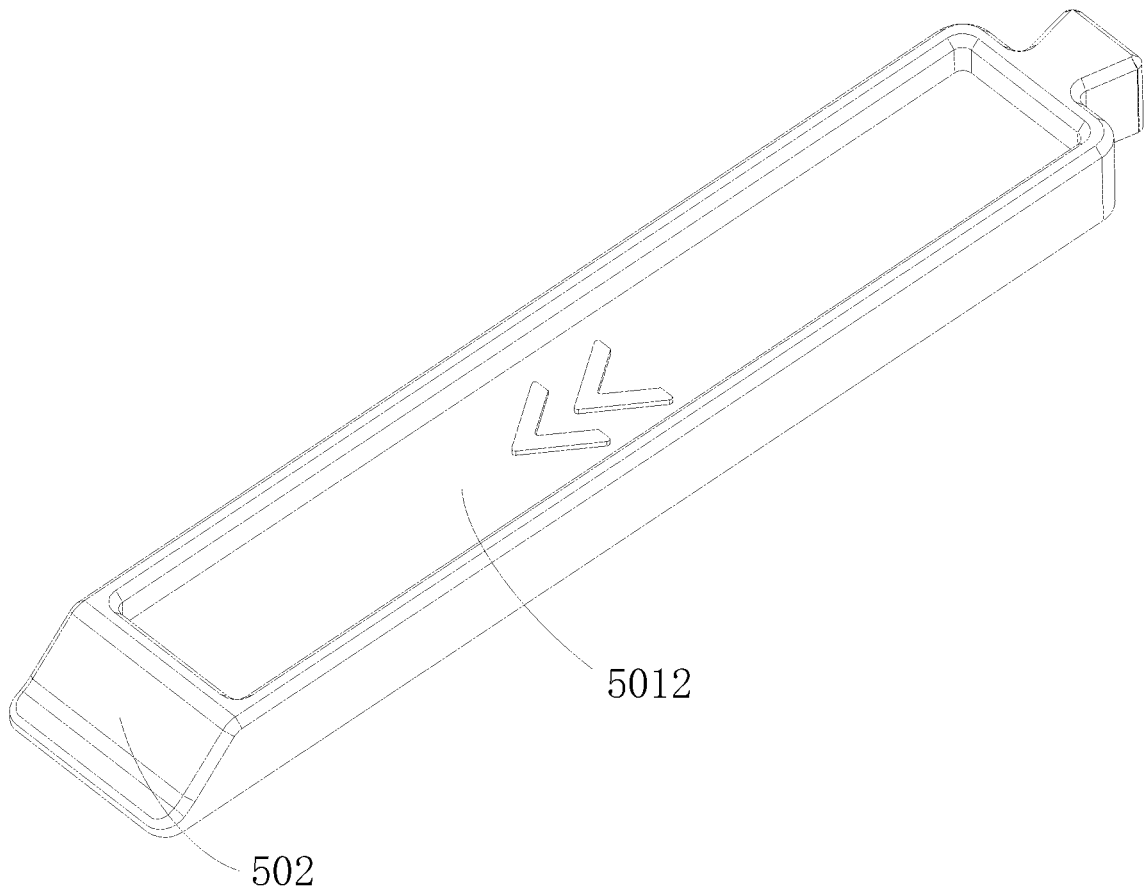
FIG. 7 is a structural schematic diagram of a second dowel bar of the present invention.
Figure 8:
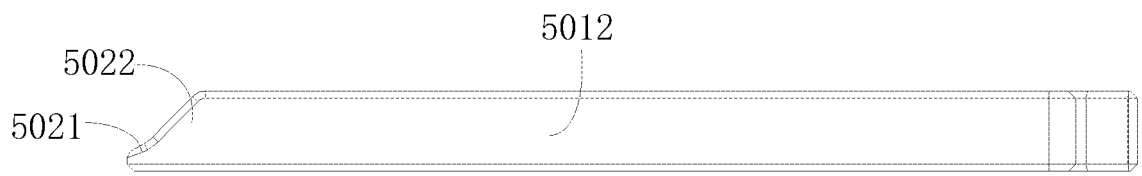
FIG. 8 is a structural schematic diagram of the second dowel bar of the present invention from another angle.

Referring to FIG. 7 to FIG. 8, and in addition, the shaft sleeve 5014 is a circular member, in order to facilitate the spiral generation processing in the connection hole 5013 thereof and reduce the production cost, it is necessary to configure the shaft sleeve 5014 and the pushing rod 5015 as two separable parts, the shaft sleeve 5014 can be machined by turning and milling, and the pushing rod 5015 can be a plastic part obtained by opening the mold, which is advantageous for reducing production cost and manufacturing difficulty.

Further, the inclined surface 502 has at least two sub-inclined surfaces 502 with different angles, the sub-inclined surfaces 502 are connected to each other, and a slop of the sub-inclined surface 502 arranged closer to the cooperative installation surface 103 of the first component is smaller than a slope of the sub-inclined surface 502 arranged farther away from the cooperative installation surface 103 of the first component.

In this way, when the dowel bar 501 is pushed and the inclined surface 502 abuts with a abutting end 301, different sliding speeds will be generated in sliding, the sub-inclined surface 502 of the abutting end 301 with a smaller slope has slower speed during the sliding process, and the sub-inclined surface 502 of the abutting end 301 with a larger slope has faster speed in the sliding process. Since a larger pushing force is required to separate the second component 20 from the first component 10 at the initial stage of starting the motor, and since the smaller the degree is, the slower the pushing speed is, and the larger the force is, the motor can separate the first component 10 from the second component 20 by larger force, so that the output force of the motor can be used efficiently. Since the second component 20 is not attracted by the magnet after separating from the first component 10, and too strong force is not required, the degree of the sub-inclined surface 502 arranged far from the cooperative installation surface 103 of the first component is increased, and the motor can output relatively minor force to complete the screen disassembly action, so that the pushing force produced by the output force of the motor is released more uniformly and effectively.

Referring to FIG. 7 to FIG. 8, and further, the sub-inclined surface 502 comprises a first sub-inclined surface 5021 and a second sub-inclined surface 5022, the first sub-inclined surface 5021 is arranged close to the cooperative installation surface 103 of the first component, the second sub-inclined surface 5022 is arranged far from the cooperative installation surface 103 of the first component, the slop of the first sub-inclined surface 5021 is 30 degrees, and the slop of the second sub-inclined surface 5022 is 45 degrees. This angle is the best angle in practical application and use.

Further, a guiding groove 101 for positioning the second dowel bar 5012 is arranged at an installation position of the second dowel bar 5012 in the first component 10, so that the second dowel bar 5012 is stuck inside the guiding groove 101 and moves along the guiding groove 101.

In this way, the storage and installation of the second dowel bar 5012 can be facilitated, and the entire second dowel bar 5012 can be prevented from protruding too much from the cooperative installation surface 103 of the first component, thus resulting in problems of ugly appearance and incontinent use and storage.

Further, the guiding groove 101 is a straight groove, the second dowel bar 5012 is a straight bar, a plurality of positioning bars 102 for positioning the straight bar are spanned on an opening of the straight groove by intervals, and the positioning bar 102 is arranged vertical to the extension direction of the straight bar.

In practical use, the second dowel bar 5012 is positioned by the positioning bar 102, and the positioning bar 102 is an integrally formed structure on the first component 10, which can reduce the processing procedure and processing complexity of the guiding groove 101, can form integrally in manufacturing of the first component 10, and prevents the second dowel bar 5012 from falling off from the first component 10. Therefore, considering the structural strength and depanning convenience, the installation structure of the second dowel bar 5012 is the preferred form.

Further, the guiding groove 101 is connected to the second dowel bar 5012 by a T-shaped ring groove structure.

In this way, the second dowel bar 5012 can be effectively positioned on the cooperative installation surface 103 of the first component, and the T-shaped ring groove can facilitate the clamping, disassembly and processing between the second dowel bar 5012 and the guiding groove 101.

Further, the guiding groove 101 is a Y-shaped groove, which has at least two branches, and the second dowel bar 5012 is a Y-shaped bar matched with the guiding groove 101.

The driving device 40 and the pushing mechanism 50 can be arranged at any position on the back of the first component 10, and can be arranged in multiple sets, when the first transmission piece 401 rotates, the second transmission piece 402 can be driven to rotate, thereby driving the first dowel bar 5011 to rotate, and when the first dowel bar 5011 rotates, the second dowel bar 5012 is driven to moves linearly. When the shape of the first component 10 is not limited to a rectangular screen, the second dowel bar 5012 is branched into a plurality of branch rods to facilitate the use of the first component 10 with irregular edges separated from the second component 20, when the first component 10 is in other shapes, such as a circle or a triangle, etc., the guiding groove 101 is provided with other branch grooves, and the second dowel bar 5012 is provided with other branch rods so as to abut with other points on the 20, which facilitates the first component 10 to be separated from the second component 20.

In any one embodiment above, the cooperative installation surface of the second component is provided with at least one abutting end. In different situations, a plurality of the unloading devices 30 can be arranged, the quantities of the abutting end 301 and the unloading device 30 are the same, or the quantity of the abutting end 301 is at least twice the quantity of the unloading device 30. Specifically, a second dowel bar 5012 provided with an inclined surface is corresponding to an abutting end 301.

Further, the abutting end 301 of the second component 20 is arranged in a raised manner, so as to facilitate the application of force to the second component 20 by the inclined surface 502 of the second dowel bar 5012.

Figure 10:
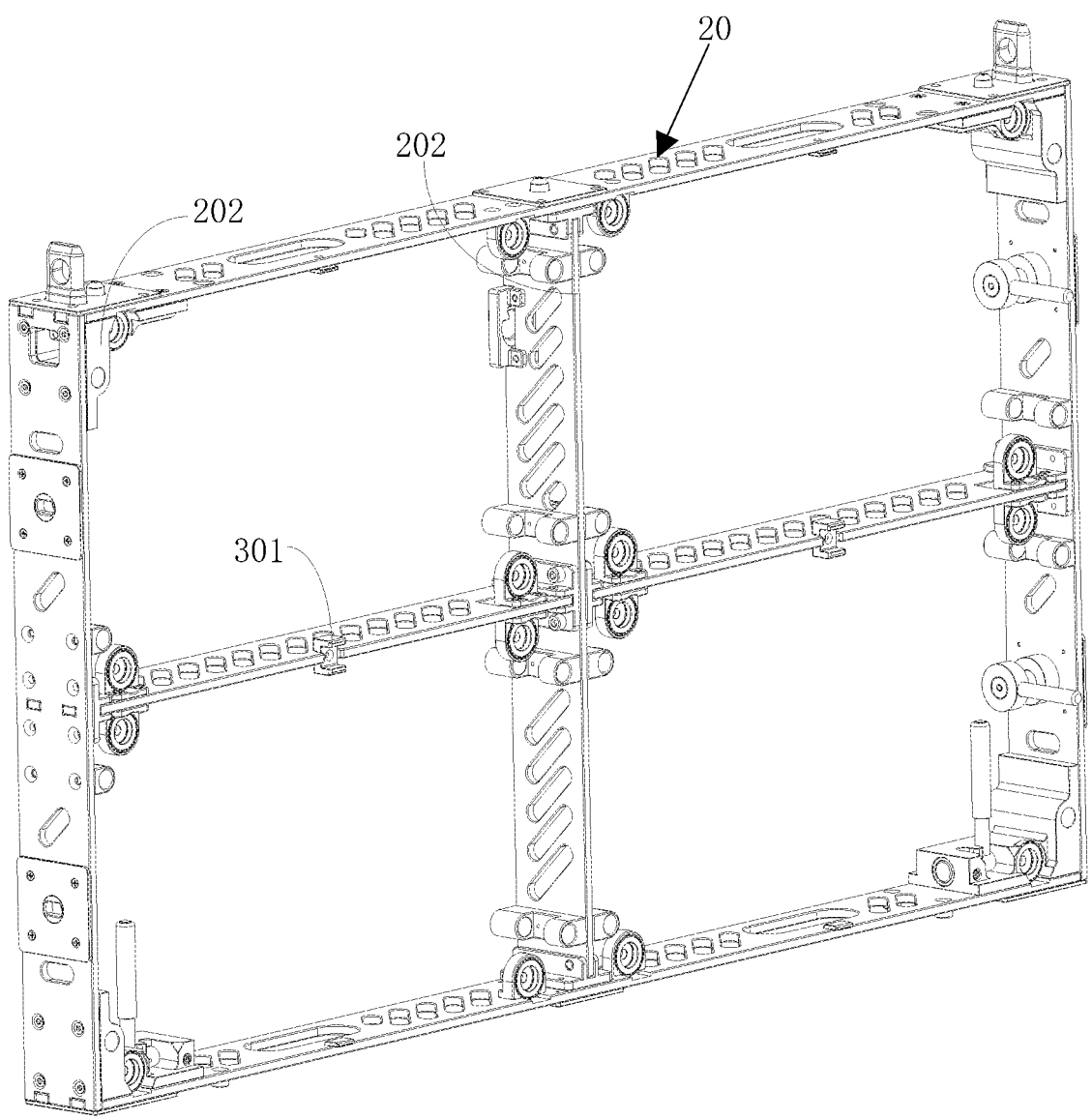
FIG. 10 is a structural schematic diagram of a frame of the present invention.
Figure 11:
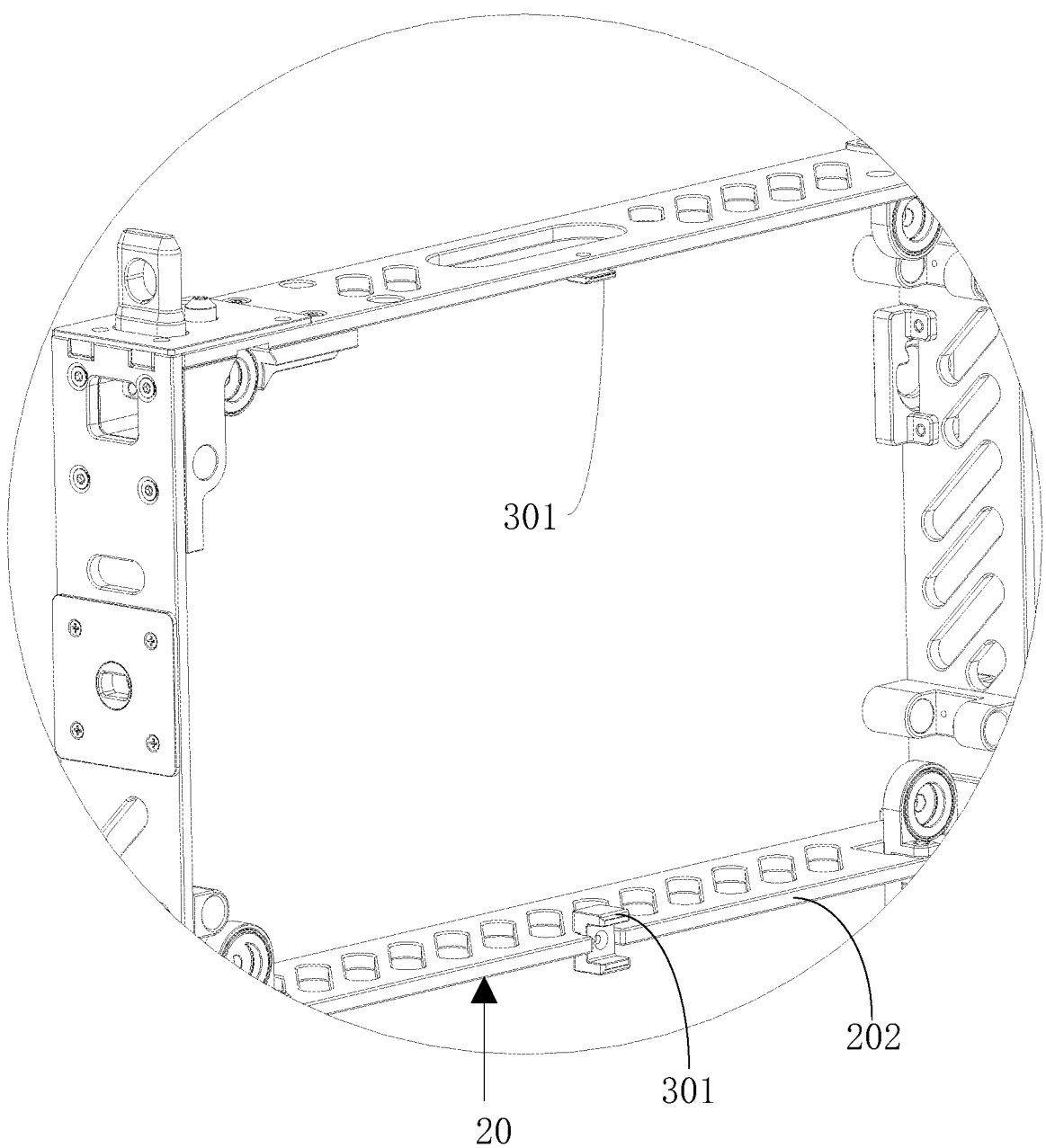
FIG. 11 is a partial enlarged schematic diagram of the frame of the present invention.

Referring to FIG. 10 and FIG. 11, the abutting end 301 is a protruding boss 201, the boss 201 is a rectangle entirely, and the boss 201 is arranged to extend towards the cooperative installation surface 103 of the first component. In this way, it is more convenient for the inclined surface 502 to be butted with the second component 20. Certainly, the shape of the boss 201 is not limited to a rectangle, but can also be a semicircle or other shapes.

The contact surface between the abutting end 301 and the inclined surface 502 is also arranged inclinedly. In order to successfully generate the relative sliding when the inclined surface 502 is contacted with the abutting end 301 and enable the second dowel bar 5012 to slid more smoothly, an inclined shape is also available, and the contact surface between the abutting end and the inclined surface can also be a transitional arc surface with a certain slope.

In the second embodiment of the present invention, the present invention further relates to a self-unloading display device, and the unloading display device comprises a display screen and a frame. Different from the first embodiment, in the present embodiment, the frame is a first component 10, the display screen is a second component 20, the frame and the display screen are cooperatively installed, the cooperative installation surface 103 of the first component is provided with the unloading device 30, and that is, the frame is provided with the unloading device 30, and when the display screen needs to be separated from the frame, the unloading device 30 abuts with the display screen.

Further, in the embodiment above, the cooperative installation surface of the frame is provided with the abutting end, so that the unloading device 30 can reversely push the frame more easily, and the driving device 40 can better push and separate the display screen from the frame by a smaller force.

In the third embodiment of the present invention, the present invention further relates to a self-unloading display device, the self-unloading display device comprises a display screen and a frame, the display screen is a first component 10, the frame is a second component 20, and the frame and the display screen are cooperatively installed. Different from the first embodiment and the second embodiment, in the present embodiment, a cooperative installation surface of the first component 10 and a cooperative installation surface of the second component 20 are both provided with the unloading device 30, and that is, the frame is provided with the unloading device 30, and the display screen is also provided with the unloading device 30, and when the display screen needs to be separated from the frame, the unloading device 30 on the frame abuts with the display screen, the unloading device 30 on the display screen abuts with the frame, and the self-unloading effect is better and more efficient under the mutual effect.

Further, in the embodiment above, the cooperative installation surface of the frame and the cooperative installation surface of the display screen are both provided with the abutting end, the unloading device 30 on the display screen abuts with the abutting end on the frame, the unloading device 30 on the frame abuts with the abutting end on the display screen, and the cooperative use of the display screen with the unloading device 30 and the frame with the unloading device 30 is available, thus forming multiple combined use modes.

In any technical solution of the first embodiment, second embodiment and third embodiment, in order to facilitate that the display screen cannot fall off from the frame immediately after separating from the frame, the cooperative installation surface 103 of the first component can be provided with at least one guidepost 60; at least one guide hole 70 is arranged at a position of the cooperative installation surface of the second component corresponding to the guidepost 60; and the guidepost 60 is inserted into the guide hole 70, when the pushing mechanism 50 applies a reaction force to the second component, the guidepost 60 moves along the guide hole 70, the guidepost 60 is arranged at each angular position of the first component, and the guidepost 60 is vertically arranged relative to the cooperative installation surface 103 of the first component. Of course, other angles between the guidepost 60 and the cooperative installation surface 103 of the first component can also be formed, which is not limited herein. The guidepost 60 is vertically arranged relative to the cooperative installation surface 103 of the first component, so that after the display screen is separated from the frame, the display screen can be conveniently removed from the frame when the operator takes away the display screen, which is also convenient for the operator to observe the state of the display screen after separating from the frame.

The guidepost 60 is a buffer such as an air-pressure rod, a hydraulic pressure rod, or an air spring, a fixed end of the guidepost 60 being a buffer such as an air-pressure rod, a hydraulic pressure rod, or an air spring is fixedly installed with the display screen or the frame, and since the other end of the guidepost 60 being a buffer such as an air-pressure rod, a hydraulic pressure rod, or an air spring is a movable end, the guidepost 60 can be retracted. Therefore, the end is arranged towards the guide hole 70, after the display screen and the frame are assembled, the movable end is located in the guide hole 70, through a pushing effect of the unloading device, when the first component 10 is separated from the second component 20, a movable end of the guidepost 60 will give a counter elastic force to the first component 10 to pop from the second component 20, or an air spring will give a counter elastic force to the second component 20 to pop from the first component 10, so as to further increase the separation force of the first component 10 or the second component 20, so that the distance between the first component 10 and the second component 20 is further increased, and the first component 10 or the second component 20 can be conveniently and automatically disassembled, thus reducing the occurrence of the failed disassembly.

The guidepost 60 is entirely an elongated cylinder having circular cross-section, which facilitates better processing and installation, and can effectively increase the sliding distance of the first component 10 on the second component 20 or the sliding distance of the second component 20 on the first component 10, thus avoiding the problem that the first component 10 or the second component 20 falls off directly. Certainly, the guidepost 60 can also be an elongated cylinder having square cross-section, or an elongated cylinder having elliptical cross-section, and certainly, the cross-section shape of the guidepost 30 is not limited to the various shapes above.

Since the cooperative installation surface of the first component 10 is provided with at least one guidepost, at least one guide hole is arranged at a position of the cooperative installation surface of the second component 20 corresponding to the guidepost, and the guidepost is inserted into the guide hole, when the pushing mechanism 50 applies a reaction force to the first component 10 while butting with the second component 20, the guidepost moves along the guide hole.

The position of the guidepost can be any position arranged at the display screen or the frame. For example, one or more positions of the guidepost can be arranged at all angular positions of the display screen or the frame, multiple positions of the guidepost can also be arranged along the side of the display screen or the frame, and the position of the guidepost can also be arranged at the center of the display screen or the frame. The guide hole can be arranged corresponding to the position of the guidepost.

Therefore, the first component 10 cannot be completely separated from the second component 20 while the pushing mechanism 50 generates a gap between the first component 10 and the second component 20, but the guidepost is inserted into the guide hole to support the first component 10 or the second component 20 when the first component is the display screen and the second component is the frame.

In practical application, the mainly technical solution adopted is that the guidepost is arranged in the display screen, the guide hole is arranged in the frame, the display screen is pulled, the guidepost will slide along the guide hole until the guidepost is completely separated from the frame, and the display screen is separated from the frame.

Therefore, when the display screen needs to be replaced, and dismantled for maintenance or changing the installation position thereof, the guiding device can assist in supporting the display screen already separated by the unloading device on the frame and generate a gap between the display screen and the frame. Therefore, when the display screen is disassembled, the operator is not necessary to disassemble the display screen from the frame completely; multiple display screens can be separated at the same time and then checked one by one, if replacement is not necessary, the display screen does not need to be disassembled from the frame completely and can be directly pushing back to the original position.

Even if the screen is completely disassembled, the screen is ejected out by the pushing mechanism, the display screen is supported in the frame by a guide bar, and the display screen can be disassembled by pulling. It is not necessary to use a strong magnetic screen disassembly device in the entire process, thus reducing the damage of the strong magnetic screen disassembly device to the LED lamp beads on a display panel during adsorption, reducing the working intensity, and improving the working efficiency.

In addition, when placing the display screen, the display screen can be supported by the guidepost which generates a gap between the display screen and a placement plane. Therefore, when the display screen is taken again, the gap is more convenient to manually pick up the display screen, and the gap also avoids the back of the display screen from directly contacting with the ground, thus reducing the wear on the back of the display screen, and reducing blot generated on the back of the display screen.

Similarly, the reverse configuration is also available, and that is, when the frame is a first component 10 and the display screen is a second component 20, the guidepost is arranged in the frame, and the guide hole is arranged in the display screen, and at the moment, the display screen is pushed by the unloading device, the display screen slides on the guidepost through the guide hole until the guide hole is completely separated from the guidepost of the frame 20.

Both the display screen and the frame can also be provided with the guidepost and the guide hole.

Figure 12:
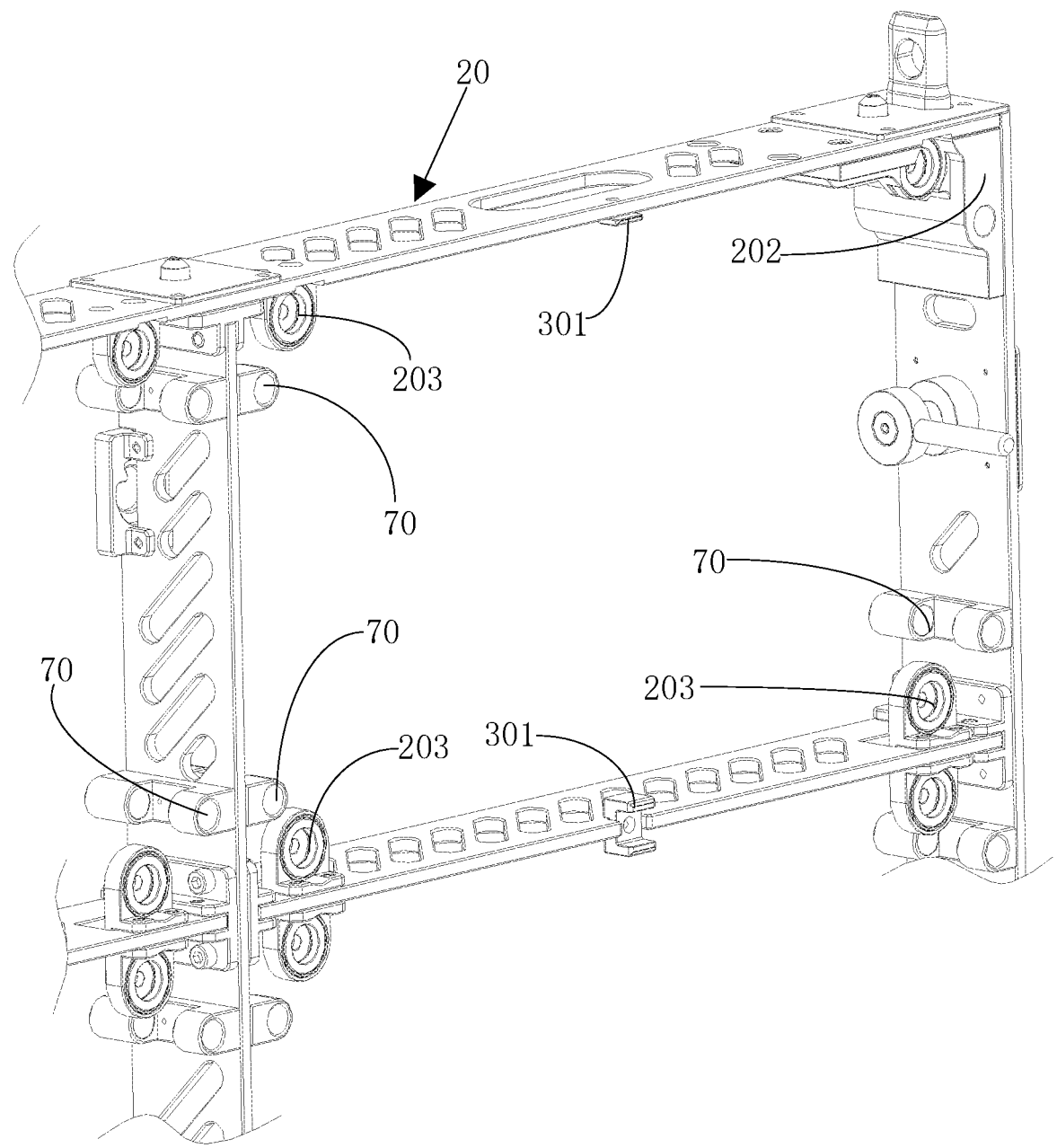
FIG. 12 is a partial enlarged schematic diagram of another position of the frame of the present invention.
Figure 13:
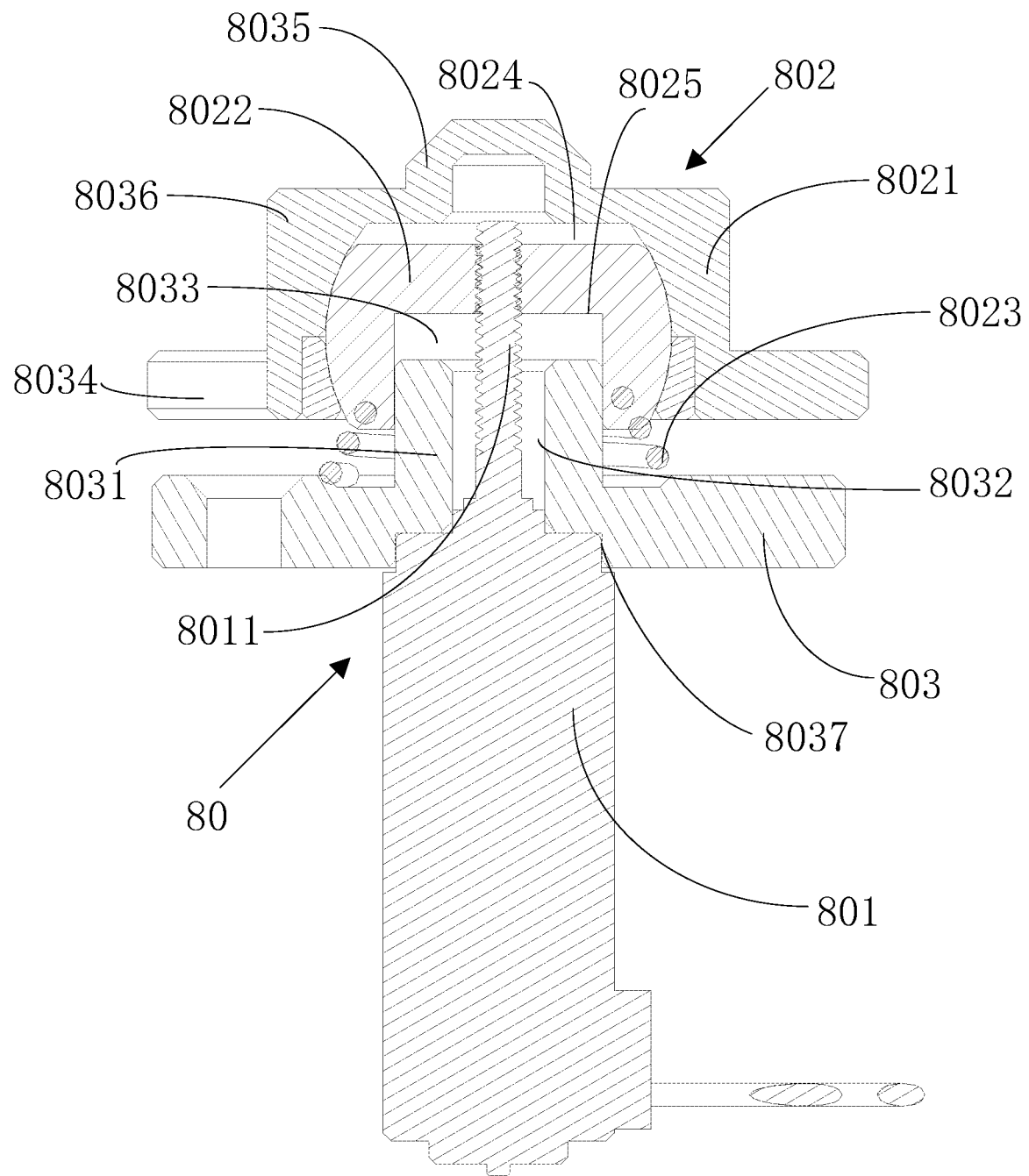
FIG. 13 is a sectional view of a leveling device of the present invention.

Referring to FIG. 11 to FIG. 13, in order to facilitate adjusting the distance between the first component 10 and the second component 20, the cooperative installation surface of the first component is provided with at least one leveling device 80, the leveling device 80 comprises a driving device 801 installed in the cooperative installation surface of the first component 10 and an adjustment head rotatably connected to the driving device 801; and the adjustment head 802 of the leveling device 80 can move upwardly or retract downwardly relative to the cooperative installation surface of the first component 10, the driving device 801 drives the adjustment head 802 to protrude outside an installation position thereof and abut with the second component 20 located on an opposite side of the installation position of the adjustment head 802.

The driving device 501 is configured as a motor having an output rod 8011 with an external thread, a center of the inner core body 8022 is provided with a screw hole in threaded connection with the output rod 8011, the adjustment head 802 comprises an upper cover head 8021, an inner core body 8022 and an elastic supporting piece 8023, the output rod 8011 is in threaded and rotational connection with the inner core body 8022 of the adjustment head 802, a center of the upper cover head 8021 is provided with a concave containing cavity 8024, an opening of the containing cavity 8024 is arranged towards the cooperative installation surface, the inner core body 8022 is arranged in the containing cavity 8024, an inner wall of the containing cavity 8024 is formed as an arc surface curved towards an external direction of the adjustment head 802, an outer wall of the inner core body 8022 is cooperatively installed with a spherical surface of the inner wall of the containing cavity 8024 to enable the inner core body 8022 to rotate in the containing cavity 8024, the elastic supporting piece 8023 is arranged between the upper cover head 8021 and the cooperative installation surface to support the inner core body 8022 on the cooperative installation surface of the first component 10, the driving device 801 is connected to the inner core body 8022 in a transmission way, the installation position of the driving device 801 is provided with a positioning head 803 for positioning the driving device on the cooperative installation surface, the positioning head 803 has a boss 8031 arranged protruding to the direction of the upper cover head 8021 and a flange surrounding around the outer side of the boss 8031, a center of the inner core body 8022 is provided with a concave socket 8025 for cooperatively installed with the boss 8031, the inner core body 8022 is installed in the boss 8031 through the socket 8025, a height of the boss 8031 is smaller than a depth of the socket 8025 to form an adjustment gap 8033, a center of the positioning head 803 is provided with a through hole 8032 for the output rod 8011 of the driving device 801 to penetrate through, and the output rod 8011 of the driving device 801 is in threaded connection with the inner core body 8022 after passing through the through hole 8032 in sequence.

Specifically, the leveling device 80 is preferably arranged at each angular position of the first component 10, so as to facilitate the leveling device 80 to adjust the angular position of the first component 10, the adjustment head 802 can move upwardly or retract downwardly relative to the cooperative installation surface of the first component 10 through driving a motor, and when some position of the first component 10 is lower than the other first component 10 on the adjacent side, the position is lifted up by the leveling device 80 to facilitate connecting the adjacent sides of the first components 10, thereby achieving the object of leveling.

Correspondingly, a groove 203 arranged corresponding to the leveling device 80 is arranged on the second component 20 correspondingly and cooperatively installed with the first component 10, when the first component 10 is cooperatively installed with the second component 20, an end part of the leveling device 80 is just contained in the groove 203, and the leveling device 80 can be positioned through the groove 203 while moving, so as to facilitate the leveling device 80 to clamp the display screen, thus avoiding relative sliding of the display screen in movement of the leveling device 80 and the problem of failed leveling.

Moreover, since the inner core body 8022 is cooperatively installed with the spherical surface of the upper cover head 8021, when the adjustment to a certain angle of direction is needed, the upper cover head 8021 can generate a certain angle of deflection, and regardless of the position of the motor and the angular installation condition, the adjustment head can always be maintained to align with the first component 10, and the maximum contact area is maintained. This situation is suitable when the first component 10 or the leveling device 80 itself are not manufactured and installed correctly, and the upper cover head 8021 can always be maintained to align with the second component 20, so as to avoid inaccurate leveling, slippage or poor leveling effect in the case that the leveling device 80 is inclined. A height of the boss 8031 is smaller than a depth of the socket 8025 to form an adjustment gap 8033, so as to give a compression and support space of the elastic supporting piece 8023, so that the elastic supporting piece 8023 can play a role of buffering when the adjustment head 802 is stressed to lift up the second component 20, thus reducing the impact of the external force on the driving device 801.

Preferably, the upper cover head 8021 is specifically formed into a hat-like shape with an outer edge horizontally extending outwards, a middle portion thereof is provided with a convex main body 8036 for forming the containing cavity 8024, and a middle portion of a top surface of the main body 8036 is provided with an top head 8036 with a radius smaller than that of the main body, so that the entire upper cover head forms a left-right symmetrical outline with a step from a the direction of longitudinal section. A top head 8035 and the main body 8036 can just be contained in the groove, and the groove is also internally provided with the step cooperated with the top head and the main body, which can be in favor of positioning of the upper cover head in the groove. One side of the positioning head 803 facing towards the motor is provided with a step groove 8037, so that the positioning head 803 can be better positioned on the motor, the flange of the positioning head 803 is provided with a screw hole, when a screw is arranged in the screw hole of the positioning head 803 to connect the positioning head 803 to the cooperative installation surface, the positioning head is pressed by the flange, and the motor is pressed by the positioning head, so that the motor is fixedly installed in the cooperative installation surface to reduce the movement and the pulsation of the motor during operation.

Since the upper cover head 8021 is specifically formed into a hat-like shape, the middle portion thereof is provided with the convex main body 8036 for forming the containing cavity 8024, the main body 8036 is provided with the top head 8035, and an entire longitudinal section thereof forms a stepped boss, the groove 203 will also be arranged into a stepped hole, the size thereof is adapted with the size of the upper cover head 8021, so that the upper cover head 8021 can just be cooperatively clamped with the step groove of the groove 203, so as to more effectively define the position of the adjustment head.

In conclusion, the unloading device 30 and the self-unloading display device provided by the present invention are simple in structure and convenient in use, can effectively improve the disassembly and assembly efficiency and reduce the damage to the LED lamp beads during the disassembly and assembly process of the display device.

Although the embodiments of the present invention have been shown and described above, it can be understood that the embodiments above are exemplary and cannot be construed as limiting the present invention. Those skilled in the art can change, modify, replace and deform the embodiments above in the scope of the present invention without departing from the principle and purpose of the present invention.

What is claimed is:

1. An unloading device having a first component and a second component cooperatively installed, the first component and the second component respectively having a cooperative installation surface, wherein:
   the cooperative installation surface of the first component is provided with at least one unloading device;
   the unloading device comprises a driving device and a pushing mechanism;
   the pushing mechanism is connected to the driving device in a transmission way, the pushing mechanism has at least a set of telescopic dowel bars, an end part of the dowel bar is an inclined surface, and a small end formed by the inclined surface is arranged close to the cooperative installation surface of the first component; and
   the driving device drives the dowel bar to move along the cooperative installation surface of the first component, when the dowel bar moves towards the second component, the inclined surface of the dowel bar abuts with and moves along the second component, so as to separate the first component from the second component, the cooperative installation surface of the second component is provided with at least one abutting end, the speed of movement of the dowel bar is not uniform.

2. The unloading device according to claim 1, wherein:
   the driving device has a first transmission piece;
   the pushing mechanism has a second transmission piece, and the first transmission piece and the second transmission piece form an interlaced shaft transmission;
   the dowel bar comprises a first dowel bar and a second dowel bar, and an axis of the second transmission piece is provided with the first dowel bar connected therewith;
   an end part of the first dowel bar is movably connected to the second dowel bar, the second dowel bar linearly moves relative to the first dowel bar, and a moving direction of the second dowel bar and an extension direction of the first dowel bar are consistent or form an included angle; and the second dowel bar is slidably arranged in the cooperative installation surface of the first component, and an end part of the second dowel bar is provided with the inclined surface.

3. The unloading device according to claim 2, wherein:
the first transmission piece is an output shaft connected to the driving device in a transmission way, and has a spiral groove on an outer surface thereof;
the second transmission piece is a gear meshed with the output shaft, so that the output shaft is connected to the gear in a worm and gear way;
an axis of the gear is provided with the first dowel bar;
the first dowel bar is a short shaft arranged on the axis of the gear; and
the second dowel bar is a bar body having a connecting hole at the end part, and the connecting hole is spirally sleeved with the short shaft.

4. The unloading device according to claim 3, wherein the driving device is a motor.

5. The unloading device according to claim 3, wherein two sets of the first dowel bars are symmetrically arranged along the axis relative to the second transmission piece.

6. The unloading device according to claim 3, wherein the second dowel bar comprises a shaft sleeve connected to the short shaft and a pushing rod detachably clamped with the shaft sleeve, one end of the shaft sleeve is provided with the connecting hole, the other end thereof is provided with a concave clamping groove, one end of the pushing rod is provided with a clamping head adapted to the clamping groove, the other end thereof is provided with the inclined surface, and the shaft sleeve is detachably clamped with the pushing rod by the clamping groove and the clamping head.

7. The unloading device according to claim 6, wherein the clamping groove is connected to the clamping head in a wedged way.

8. The unloading device according to claim 2, wherein:
the first transmission piece is a gear rack connected to the driving device in a transmission way, and the surface thereof has gear teeth;
the second transmission piece is a gear meshed with the gear rack, so that the gear rack is connected to the gear in a gear rack way;
an axis of the gear is provided with the first dowel bar;
the first dowel bar is a short shaft arranged on the axis of the gear; and
the second dowel bar is a bar body having a connecting hole at the end part, and the connecting hole is spirally sleeved with the short shaft.

9. The unloading device according to claim 2, wherein the end of the second dowel bar provided with the inclined surface is formed with a pushing head having a width larger than the width of the second dowel bar.

10. The unloading device according to claim 2, wherein a guiding groove for positioning the second dowel bar is arranged at an installation position of the second dowel bar in the cooperative installation surface of the first component, so that the second dowel bar is stuck inside the guiding groove and moves along the guiding groove.

11. The unloading device according to claim 10, wherein the guiding groove is a straight groove, the second dowel bar is a straight bar, a plurality of positioning bars for positioning the straight bar are spanned on an opening of the straight groove by intervals, and the positioning bar is arranged vertical to the extension direction of the straight bar.

12. The unloading device according to claim 10, wherein the guiding groove is connected to the second dowel bar by a T-shaped ring groove structure.

13. The unloading device according to claim 10, wherein the guiding groove is a Y-shaped groove, which has at least two branches, and the second dowel bar is a Y-shaped bar matched with the guiding groove.

14. The unloading device according to claim 1, wherein the inclined surface has at least two sub-inclined surfaces with different angles, the sub-inclined surfaces are connected to each other, and a slop of the sub-inclined surface arranged closer to the cooperative installation surface of the first component is smaller than a slope of the sub-inclined surface arranged farther away from the cooperative installation surface of the first component.

15. The unloading device according to claim 14, wherein the sub-inclined surface comprises a first sub-inclined surface and a second sub-inclined surface, the first sub-inclined surface is arranged close to the cooperative installation surface of the first component, the second sub-inclined surface is arranged far from the cooperative installation surface of the first component, the slop of the first sub-inclined surface is 30 degrees, and the slop of the second sub-inclined surface is 45 degrees.

16. The unloading device according to claim 1, wherein the abutting end of the second component is arranged in a raised manner.

17. The unloading device according to claim 1, wherein the abutting end is a protruding boss, the boss is a rectangle entirely, and the boss is arranged to extend towards the cooperative installation surface of the first component.

18. The unloading device according to claim 1, wherein a contact surface between the abutting end and the inclined surface is also arranged inclinedly.

19. A self-unloading display device comprising an unloading device, wherein the unloading device is the unloading device according to claim 1, the self-unloading display device comprises a display screen and a frame, the display is a first component, the frame is a second component, the display screen and the frame are cooperatively installed, and a cooperative installation surface of the first component is provided with the unloading device.

* * * * *